(12) United States Patent
Chan

(10) Patent No.: US 7,573,292 B1
(45) Date of Patent: Aug. 11, 2009

(54) PRE-PROGRAMMED INTEGRATED CIRCUIT INCLUDING PROGRAMMABLE LOGIC

(75) Inventor: Vi Chi Chan, Hong Kong (CN)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 12/032,559

(22) Filed: Feb. 15, 2008

(51) Int. Cl.
*H03K 19/173* (2006.01)
*G06F 7/38* (2006.01)

(52) U.S. Cl. .................. 326/38; 326/40; 365/185.04

(58) Field of Classification Search .......... 326/38–41, 326/46, 47; 365/185.04
See application file for complete search history.

(56) References Cited

U.S. PATENT DOCUMENTS 6,845,276 B2 * 1/2005 Bocchi .................. 700/61
7,391,237 B2 * 6/2008 Fang et al. .............. 326/46
2007/0133280 A1 * 6/2007 Oshiba et al. ......... 365/185.04

* cited by examiner

*Primary Examiner*—Daniel D Chang
(74) *Attorney, Agent, or Firm*—W. Eric Webostad; Lois D. Cartier

(57) ABSTRACT

A system for providing a pre-programmed integrated circuit including programmable logic, and method for providing same. The system includes: nonvolatile memory capable of having first data stored therein and an integrated circuit coupled with the nonvolatile memory. The first data is associated with a predetermined design, and the integrated circuit includes programmable logic having a user region and a reserved region. The integrated circuit is configured to obtain the first data from the nonvolatile memory for instantiation of the predetermined design in the reserved region.

20 Claims, 3 Drawing Sheets

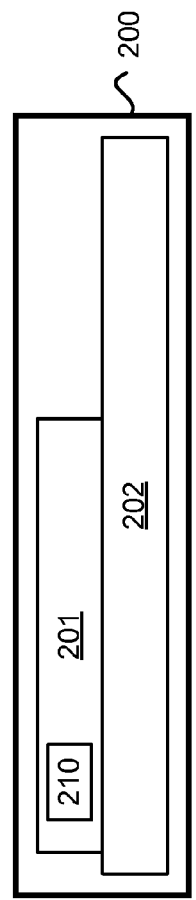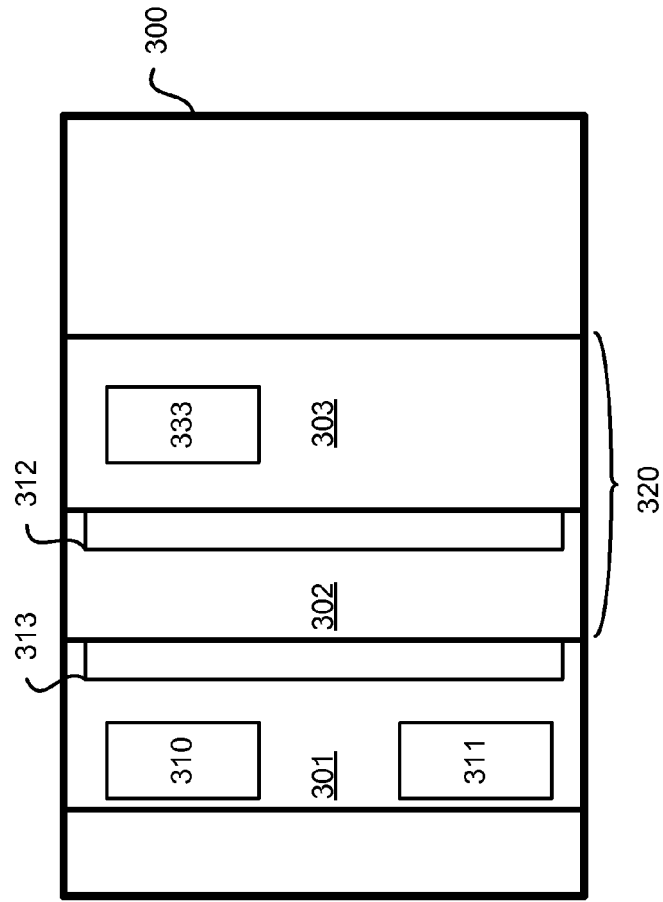

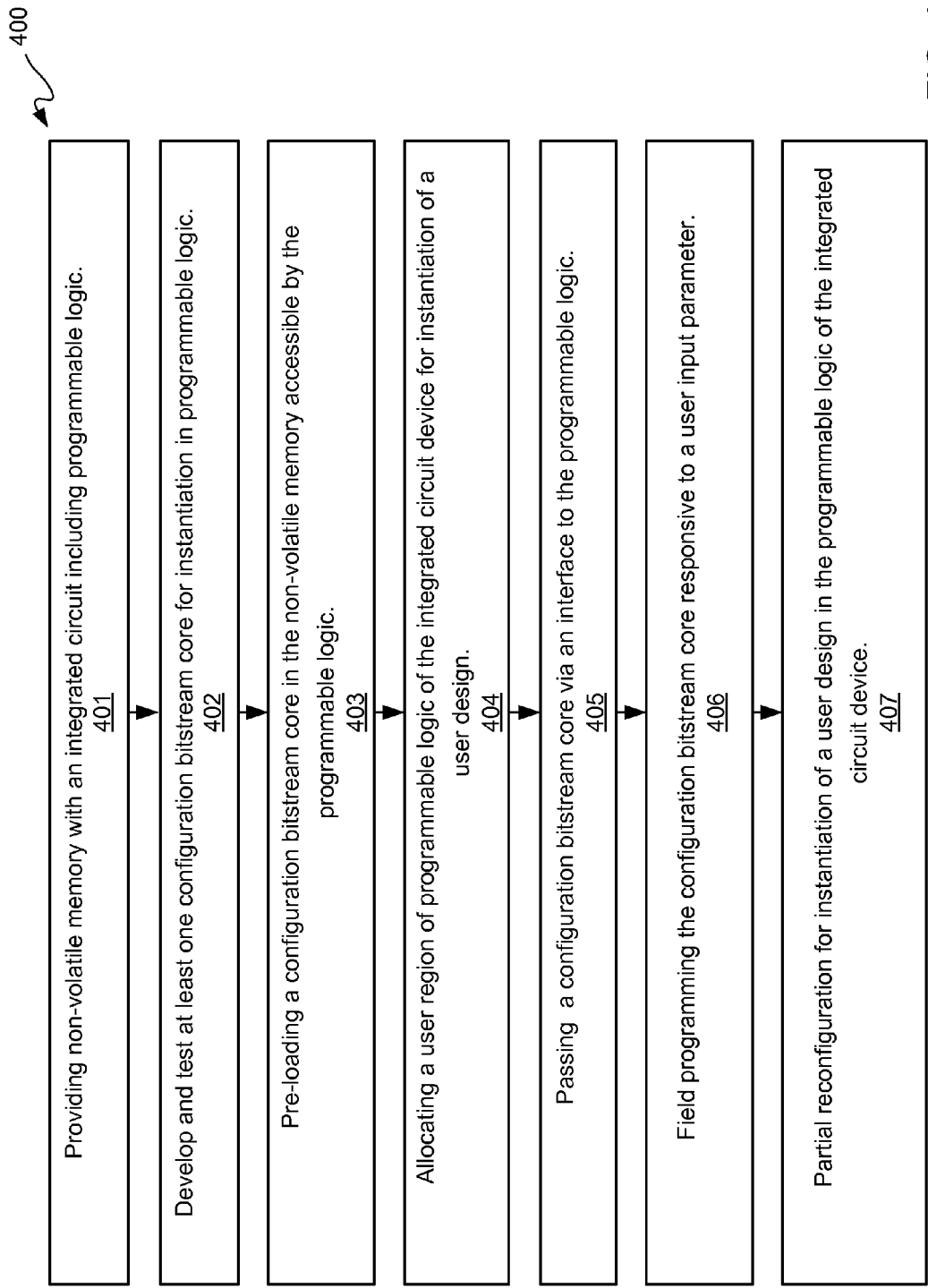

PRE-PROGRAMMED INTEGRATED CIRCUIT INCLUDING PROGRAMMABLE LOGIC

FIELD OF THE INVENTION

The invention relates to integrated circuit devices (ICs). More particularly, the invention relates to a pre-programmed integrated circuit including programmable logic.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in nonvolatile memory. In some CPLDs, configuration data is stored on-chip in nonvolatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in nonvolatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Some FPGAs, such as the Virtex™ FPGA family, available from Xilinx, Inc. of San Jose, Calif., can be programmed to incorporate blocks with pre-designed functionalities, i.e., "cores." A core can include a predetermined set of configuration bits that program the FPGA to perform one or more functions. Alternatively, a core can include source code or schematics that describe the logic and connectivity of a design. Typical cores can provide, but are not limited to, digital signal processing (DSP) functions, memories, storage elements, and math functions. Some cores include an optimally floorplanned layout targeted to a specific family of FPGAs. Cores can also be parameterizable, i.e., allowing the user to enter parameters to activate or change certain core functionality.

Conventionally, cores have been targeted to a lowest common denominator for deployment across FPGAs of a family. This in part has been due to not knowing where in the FPGA programmable circuitry ("FPGA fabric") a user may instantiate a core. Additionally, one or more cores may be part of an overall user design, and thus integration and verification of such overall design includes each core used therein. Furthermore, because one or more cores may be part of the overall user design, each of such cores may be recompiled each time a user's design is changed. This recompilation may lead to variation in behavior, which may lead to issues with design convergence.

To avoid complexity associated with system level designs involving instantiation of a user design including one or more cores in FPGA fabric, Application Specific Standard Products (ASSPs) have been used with FPGAs. Basically, the ASSP takes the place of the core in the user design. Use of an ASSP may save time with respect to system integration and verification issues, as customer off-the-shelf (COTS) ASSPs having known functional and timing compliance may be "black boxed."

However, use of ASSPs means having to use a widely accepted design protocol, as ASSPs conventionally are not made for an industry known design protocol if such is not widely accepted. Furthermore, ASSPs may not support optional features of such widely accepted protocols. Lastly, use of an ASSP means that the ASSP has to be interfaced with other ICs on a circuit board including the FPGA, and use of such ASSP takes up circuit board space and thermal budget.

Still others have incorporated FPGA hardware into an Application Specific Integrated Circuit (ASIC). However, such an FPGA-ASIC hybrid has conventionally been too costly in some applications due to developmental costs of the FPGA-ASIC hybrid. Additionally, FPGA-ASIC hybrids may have too long a time-to-market delay when compared with using COTS ASSPs and FPGAs in combination.

Lastly, a Programmable System-on-Chip (PSOC) may be used. A PSOC is an ASSP with fixed functionality integration of one or more interfaces together with a programmable fabric region. However, such fixed function interfaces limit application of PSoCs.

SUMMARY OF THE INVENTION

One or more aspects of the invention generally relate to a pre-programmed integrated circuit including programmable logic.

An aspect of the invention relates generally to a system including: nonvolatile memory capable of having first data stored therein and an integrated circuit coupled with the nonvolatile memory. The first data is associated with a predetermined design, and the integrated circuit includes programmable logic having a user region and a reserved region. The integrated circuit is configured to obtain the first data from the nonvolatile memory for instantiation of the predetermined design in the reserved region.

Another aspect relates generally to a method of providing a system. The method includes: coupling nonvolatile memory with an integrated circuit, where the integrated circuit has programmable logic that is partitioned into a user region and a reserved region; and preloading first data associated with a predetermined design in the nonvolatile memory.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 2 is a block diagram depicting an exemplary embodiment of stacked die package.

FIG. 3 is a block diagram depicting an exemplary embodiment of an integrated FPGA die.

FIG. 4 is a flow diagram depicting an exemplary embodiment of a IC provisioning and use flow.

DETAILED DESCRIPTION OF THE DRAWINGS

Figure 1:
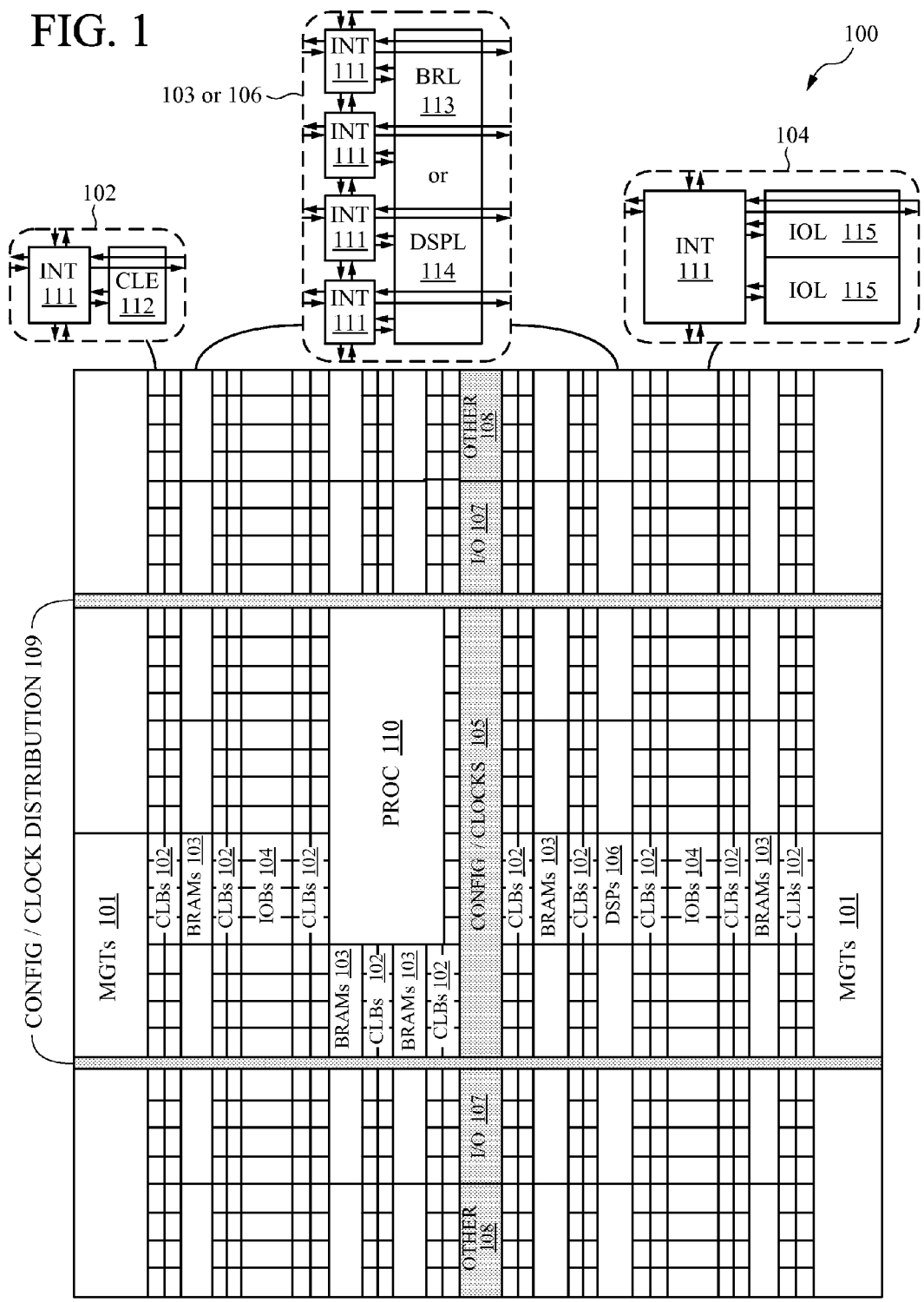
FIG. 1 is a simplified block diagram depicting an exemplary embodiment of a columnar Field Programmable Gate Array (FPGA) architecture in which one or more aspects of the invention may be implemented.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

An IC product is described where an FPGA semiconductor die ("die") and a flash memory die are coupled with one another. In another example, the flash memory die and the FPGA die may be in a same IC package. Alternatively, an array of flash memory may be integrated in the FPGA die. Thus, either an integrated die or a stacked die package may be used.

FIG. 2 is a block diagram depicting an exemplary embodiment of stacked die package 200. Stacked die package 200 is an IC that includes flash memory die 201 and FPGA die 202 coupled to one another. In another example, a flash memory package may be stacked with a packaged FPGA, where the packaged FPGA may include contacts or an interface for the flash memory. Flash memory die 201 is preloaded with at least one configuration bit stream core ("core") 210. Such preloading may be done by a manufacturer of stacked die package 200. Alternatively, such preloading may be done by an intermediary in the supply chain between the manufacturer of stacked die package 200 and an end user thereof. By "preloading," "preloaded," or "preload," it is generally meant loading of at least one core in nonvolatile memory for instantiation in a reserved region as described herein.

A flash memory may be used as such nonvolatile memory; however, other types of nonvolatile memory may be used instead of flash memory. Some details regarding stacked die package 200, such as pin-outs, wire bonding or other die-to-die coupling, are not described for purposes of clarity.

FIG. 3 is a block diagram depicting an exemplary embodiment of an integrated circuit die 300. Integrated circuit die 300 may include programmable logic and flash memory array 301 having a memory interface 313. A core 310, and optionally a core 311, are preloaded in flash memory array 301 of integrated circuit 300. In some examples, integrated circuit die 300 may be an FPGA, such as FPGA 100. FIG. 3 is just a block diagram representing an integrated circuit including a user area 303 and reserved area 302, sizes, shapes, and locations of such areas, e.g., areas 302 and 303, may be different from what is illustratively shown in FIG. 3.

Integrated circuit 300 further includes programmable logic 320, a reserved region 302 of which is reversed for instantiation of cores 310 and 311. Examples of programmable logic 320 are described with reference to FPGA 100 of FIG. 1. For purposes of clarity and not limitation, the following description is in terms of integrated circuit dies 300 even though much of such description may be applied to stacked die package 200 as shall be apparent.

The instantiation of core 310, and optionally core 311, provides a boundary interface 312 instantiated in reserved region 302. Even though both of cores 310 and 311 may be instantiated in reserved region 302, for purposes of clarity only core 310 is described as being instantiated in reserved region 302.

An unreserved or user programmable region ("user region") 303 of programmable logic may be used to instantiate a user design 333. By having boundary interface 312 be predetermined or otherwise predictable, user design 333 may be configured a priori for coupling to a core 310 instantiated in reversed area 302. For example, reserved region 302 and user region 303 may generally be mutually exclusive.

Thus generally as part of or after a power on cycle, programming information stored in flash memory, such as core 310, may be used to program a reserved region 302 of programmable logic 320 leaving the rest of programmable logic 320, such as for example user region 303, unprogrammed.

With respect to an end user, reserved region 302 may thus appear as part of a set of preexisting features of integrated circuit die 300. Thus, FPGA may be preprogrammed with core 310 for instantiation in reserved region 302 to provide a protocol compliant interface. For example, such a protocol compliant interface may be a peripheral component interconnect ("PCI") interface or form thereof may be instantiated in reserved region 302 responsive to a core 310. Other types of protocol compliant interfaces may be used. Another example for core 310 may be a signal processing macro which may include one or more DSP blocks of integrated circuit 300, as well as other resources of programmable logic 320.

Furthermore, a core 310 may be in part field programmed responsive to user selection from a set of optional parameters. For example, data width of a bus associated with boundary interface 312 may be set by a user responsive to a user selected input parameter of core 310. For example, depth of first-in/first-out buffers interfaced with a serial transceiver, such as an MGT, may be field programmable parameter of core 310 for a signal processing macro with a programmable data width. Other types of field selectable parameters for boundary interface 312 may be used and may depend on the protocol of the protocol compliant interface being instantiated.

By specifying resources to use in programmable logic 320 of reversed region 302, as well as specific locations within reserved region 302, higher performance than that conventionally available with a conventional core, may be obtained.

Because of the predictability of the instantiation of core 310, core 310 may be highly optimized for performance, including reliable timing.

Furthermore, because of the flexibility in the instantiation of core 310, core 310 may include customized features. For example, a protocol, such as a communication or interface protocol, may have optional features which are not part of a standard set of protocol features owing to any of a variety of factors. However, because core 310 may be customized to a user's request, core 310 may include functionality associated with one or more optional features of a protocol as well as standard features thereof.

From users point of view, it should be appreciated that reversed region 302 which may be preprogrammed, namely programmed with a manufacturers preloaded core 310, may not be visible to a user. In fact a user may be masked off from being able to write to reserved region 302. However, the interface, such as boundary interface 312 provides wrapper logic allowing core 310 to predictably be coupled to after instantiation in reserve region 30.

Thus, user design 333 for instantiation in user region 303 may be designed with a prior knowledge of boundary interface 312. Furthermore, in addition to possibly the pins or points of contact to boundary interface 312, configuration attributes associated with boundary interface 312 may be predictable, including timing, control signaling, latency, and other configuration attributes.

By preloading core 310 in nonvolatile memory, such as flash memory array 301, as part of delivering an integrated circuit product, such as integrated circuit 300 or an FPGA (e.g., FPGA 100 of FIG. 1), the integrated circuit product may appear more like an ASSP. In other words, a user may only focus on user region 303 for instantiation of user design 333 and implementation issues previously associated with inclusion of a core in such user design may be generally reduced to a fixed set of parameters. For example, circuitry for a protocol, as well as timing closure associated with such circuitry, may no longer concern a user due to predictability of core 310. By freeing a user from having to deal with many design issues previously associated with inclusion of a core in a user design, time to market for such user design may be reduced.

For example, core 310 may have well defined functions that have a high demand in an industry, such as protocols like PCI Express or Gigabit Ethernet. However, less popular functions for these protocols or less popular protocols, which were previously unavailable due to insufficient demand, may now be included. By having cores supply popular protocols with or without optional features or supply less popular protocols for instantiation in programmable logic circuitry, FPGAs may be configured responsive to a user's input without having to have an extensively stratified inventory of FPGA platforms to support such user input. Rather, such user input may be supported by having a variety of cores from which to select.

In addition to reducing burden for system level verification timing closures and integration by providing a core 310 with reliable predictability, it should further be appreciated that core 310 being apart from a configuration bitstream used to provide user design 333 need not be recompiled each time user design 333 is revised. In other words, boundary interface 312 with respect to a user design 333 is generally a static interface subject a core 310 capable of user selectable parameterization. But once all user parametric input is loaded, it should still be understood that boundary interface 312 is predictable.

Thus if a user changes user design 333, not only is recompilation time reduced by not having to recompile cores 310, but verification of software behavior is enhanced as changes which may affect performance or other issues may be more readily isolated to user design 333. Furthermore, if a protocol were to change, it should be appreciated that core 310 may be updated in contrast to immutable hardware. Moreover, if a problem was later discovered with core 310, core 310 may be updated with a patch or fix in contrast to immutable hardware. Thus, the ability to provide an upgrade or update path which may be instantiated in programmable circuitry has advantages over predetermined functions that are not changeable owing to instantiation in hardware. Core 310 with a patch or a fix may entirely replace a previously loaded core 310 without such patch or fix. Alternatively, rather than entirely replacing core 310, configuration data patches or fixes may be incrementally written to nonvolatile memory for a previously loaded core 310.

Memory interface 313 may be tailored circuitry for loading core 310 into flash memory array 301, as well as for configuring reserved region 302 with core 310. FPGAs available from Xilinx, Inc. of San Jose, Calif., include an internal configuration interface, namely an Internal Configuration Access Port (ICAP), which may be used for internal configuration, namely configuration of reserved region 302. Thus, partial configurability of integrated circuit 300 may be used for configuring or reconfiguring reserved region 302. Furthermore, by using an ICAP, reserved region 302 whether prior to instantiation and operation of user design 333 or dynamically while operating user design 333, may be configured or reconfigured.

FIG. 4 is a flow diagram depicting an exemplary embodiment of an IC provisioning and use flow 400. At 401, nonvolatile memory with an integrated circuit including programmable logic, such as integrated circuit 300, is provided. Such nonvolatile memory, as previously described, may be flash memory array 301. As previously mentioned, integrated circuit 300 is described for purposes of clarity and not limitation as stacked die package 200 may be used instead of integrated circuit 300. Furthermore, though the example of an FPGA is used, it should be appreciated that any integrated circuit with programmable logic in accordance with the description herein may be used.

The remainder of flow 400 is described with simultaneous reference to FIGS. 3 and 4.

At 402, core 310 for instantiation in reserved region 302 of programmable logic circuitry 320 is developed and tested. As core 310 is developed and tested at 402 for reserved region 302, the specific locations in reserved region 302 may be called out. Core 310 may therefore call out particular traces and particular circuitry, even down to a gate level, located within reserved region 302. It should be understood that a manufacturer of an integrated circuit, such as an FPGA or other integrated circuit, may have a more highly developed understanding of the circuitry in reserved region 302. Using this more adept understanding, core 310 may call out specific gates, specific lines, and other circuitry for a "bottom-up" design flow.

Because of this highly detailed and integrated relationship between programmable circuitry of reserved region 302 and core 310, performance and reliance of core 310 may be greater than that of a conventional core. Furthermore, a user may request particular features to be included, and thus a core 310 may include either or both popular functions or less popular functions as requested by a user. Though it is possible to design cores to cover any possible function, economies of scale for development of such cores may be problematic. Accordingly, features may be included in cores if a use threshold is met, though such use threshold need not be set as high as to be limited to only required features of a standard.

At 403, the core developed and tested at 402 may be preloaded into flash memory array 301. Memory interface 313, which may be included as part of integrated circuit 300, may facilitate the coupling of core 310 for instantiation in reserved region 302. Alternatively, memory interface 312 may be provided in part using programmable logic circuitry.

In addition to the ability to relatively easily change programming of cores for providing to customers with different requested functions, an FPGA vendor may have a wide selection of possible features without having a stratified inventory of parts as previously described, and further may have more available FPGAs to use as those with reserved region regional defects may be used. An FPGA manufacturer may have a platform of FPGAs which perform various functions subject to which cores are loaded into nonvolatile memory of such FPGAs. To some extent, different functionalities may be provided which may appear as customized integrated circuits for customers.

Because there may be design problems in a hardware functional blocks of such FPGAs, such design problems, which were fixed using generally available spare gates, may now be fixed using spare gates in a reserved region 302. For example, an MGT is presently used in conjunction with a calibration block. This calibration block was added to correct a design problem and was previously supplied as a configuration bitstream core or other data stored in nonvolatile memory, such as a flash memory, to be incorporated in user design 333. However, now such a calibration block may be a core, such as core 311, which is stored in flash memory array 301. Thus, the user no longer has to be aware of additional circuitry to fix a design, because core 311 may be instantiated in programmable logic of reserved region 302 without affecting predictability of boundary interface 312. Thus, fixes or patches may be preprogrammed into flash memory array 301 of integrated circuit 300 such that they are transparent to a user.

Additionally, there may be circuit defects in one or both of reserved region 302 and user region 303 which are identified during a testing phase of integrated circuit 300. However, because core 310 may be configured to avoid such defects, defective routes or memory cells may be bypassed by selecting functionally equivalent working alternatives in calling out circuitry resources for instantiation of core 310 in reserved region 302. Thus, a die with some defects may still be used if those defects for example occur within reserve region 302 and each core to be instantiated in such region 302 does not use those defective circuits. Such one or more defects in the programmable logic, e.g., reserved region 302, may not be noticeable by a user, and bypassing such one or more defects may increase semiconductor die yield.

After preloading core 310 in flash memory array 301, which is accessible by programmable logic circuitry 320 of reserved region 302 at 403, at 404 a manufacturer may specify an allocated user region 303 of programmable logic circuitry 320. User region may be for instantiation of one or more user designs 333. The allocated user region 303 may be associated with boundary interface 312 for predictably coupling with an instantiated core 310 in reserved region 302. One or more user designs 333 may be instantiated before or after instantiation of core 310.

At 405, a configuration interface, which may form part of memory interface 313, may be used to instantiate core 310 in user region 302. Optionally, at 406 a user may field program core 310 with parametric input, provided core 310 is configured to receive such parametric input. At 407, integrated circuit 300 may be partially configured or reconfigured by instantiating a user design 333 in user region 303.

Thus it should be appreciated that by affectively black boxing cores for use by a user where a predictable boundary interface is provided, customers may be able to design circuits for instantiation in such an FPGA more readily. Furthermore, a user may select a preprogrammed offering from an FPGA manufacturer which more closely matches their user design or their intended user design. Value added features or protocol optional features may be included in such cores by a manufacturer, even though such value added or optional features are not presently widely used.

Moreover, time to market for the user may be reduced as a user may focus on instantiating its user design 333 in a user region 303 with coupling to boundary interface 312. Thus, run time and system integration issues for a user are significantly reduced because what amounts to the preprogrammed reserved region is presented to a user as a black box, though optionally with customizable features, a predictable boundary interface 312.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

What is claimed is:

1. A system, comprising:
nonvolatile memory for storing first and second data;
the first data associated with a predetermined design;
an integrated circuit coupled with the nonvolatile memory;
the integrated circuit including programmable logic;
the programmable logic having a user region and a reserved region; and
the integrated circuit configured to obtain the first data from the nonvolatile memory for instantiation of the predetermined design in the reserved region,
wherein the second data is for instantiating a user design in the user region.

2. The system according to claim 1, wherein the first data specifies resources of the reserved region for the instantiation of the predetermined design.

3. The system according to claim 2, wherein the predetermined design complies with a design protocol.

4. The system according to claim 3, wherein the predetermined design complies with optional features of the design protocol.

5. The system according to claim 2, wherein the first data avoids one or more defects of the reserved region.

6. The system according to claim 2, wherein the first data includes a predetermined interface for coupling a user design to the predetermined design.

7. The system according to claim 6, wherein:
the second data is for instantiating the user design in the user region and for coupling the user design to the predetermined interface.

8. The system according to claim 1, wherein:
the first data is selected from a set of configuration core data responsive to user input.

9. The system according to claim 8, wherein a portion of the nonvolatile memory for storage of the set of configuration core data is not accessible by a user.

10. The system according to claim 1, wherein the nonvolatile memory and the programmable logic are part of a same die.

11. The system according to claim 1, wherein the nonvolatile memory and the integrated circuit are separate dice packaged together.

12. A method of providing a system, comprising:
coupling nonvolatile memory with an integrated circuit;
the integrated circuit including programmable logic;
partitioning the programmable logic to have a reserved region and a user region;
preloading first data associated with a predetermined design in the nonvolatile memory; and
preloading second data associated with a user design in the nonvolatile memory,
wherein the first data is for instantiating the predetermined design in the reserved region, and
wherein the second data is for instantiating the user design in the user region.

13. The method according to claim 12, further comprising:
obtaining the first data by the integrated circuit for instantiation of the predetermined design in the reserved region.

14. The method according to claim 13, wherein the reserved region includes at least one defect which is masked off from the predetermined design.

15. The method according to claim 12, further comprising selecting the first data from a set of configuration bitstream core data responsive to user input.

16. The method according to claim 12, further comprising replacing the first data in the nonvolatile memory with second data conforming to an update of the predetermined design.

17. The method according to claim 12, further comprising writing second data to the nonvolatile memory conforming to an update of the predetermined design.

18. The method according to claim 12, further comprising preloading the system with at least one configuration bitstream core associated with the first data in the nonvolatile memory.

19. The method according to claim 18, further comprising obtaining a customer order specifying the at least one configuration bitstream core.

20. The method according to claim 12, wherein:
the first data includes a predetermined interface for coupling a user design to the predetermined design; and
the second data is for instantiating the user design in the user region and for coupling the user design to the predetermined interface.

* * * * *